United States Patent
Basol

(10) Patent No.: US 6,534,116 B2
(45) Date of Patent: Mar. 18, 2003

(54) PLATING METHOD AND APPARATUS THAT CREATES A DIFFERENTIAL BETWEEN ADDITIVE DISPOSED ON A TOP SURFACE AND A CAVITY SURFACE OF A WORKPIECE USING AN EXTERNAL INFLUENCE

(75) Inventor: Bulent Basol, Manhattan Beach, CA (US)

(73) Assignee: Nutool, Inc., Milpitas, CA (US)

( * ) Notice: Subject to any disclaimer, the term of this patent is extended or adjusted under 35 U.S.C. 154(b) by 0 days.

(21) Appl. No.: 09/740,701

(22) Filed: Dec. 18, 2000

(65) Prior Publication Data

US 2002/0074230 A1 Jun. 20, 2002

Related U.S. Application Data

(60) Provisional application No. 60/224,739, filed on Aug. 10, 2000.

(51) Int. Cl.[7] .............................. B05D 5/12; B05D 3/00; C25D 5/02; C25D 5/18; C25D 3/38
(52) U.S. Cl. .................... 427/97; 427/98; 427/299; 205/118; 205/123; 205/210; 205/104; 205/291; 205/239; 205/137
(58) Field of Search ...................... 427/97, 98, 299; 205/118, 123, 210, 104, 291, 239, 137

(56) References Cited

U.S. PATENT DOCUMENTS

| | | | |
|---|---|---|---|
| 6,004,880 A | 12/1999 | Liu et al. ................... | 438/692 |
| 6,090,239 A | 7/2000 | Liu et al. ................... | 156/345 |
| 6,224,737 B1 * | 5/2001 | Tasi et al. .................. | 205/123 |
| 6,245,676 B1 | 6/2001 | Ueno ......................... | 438/687 |
| 6,284,121 B1 * | 9/2001 | Reid .......................... | 205/123 |
| 6,303,014 B1 | 10/2001 | Taylor et al. .............. | 205/103 |

FOREIGN PATENT DOCUMENTS

| | | |
|---|---|---|
| EP | 1 063 696 A1 | 12/2000 |
| EP | 1 122 989 A2 | 8/2001 |
| JP | 11-238703 | 8/1999 |

\* cited by examiner

*Primary Examiner*—Edna Wong
(74) *Attorney, Agent, or Firm*—Pillsbury Winthrop LLP

(57) ABSTRACT

The present invention relates to methods and apparatus for plating a conductive material on a substrate surface in a highly desirable manner. The invention removes at least one additive adsorbed on the top portion of the workpiece more than at least one additive disposed on a cavity portion, thereby allowing plating of the conductive material take place before the additive fully re-adsorbs onto the top portion and causing greater plating of the cavity portion relative to the top portion.

30 Claims, 8 Drawing Sheets

US 6,534,116 B2

PLATING METHOD AND APPARATUS THAT CREATES A DIFFERENTIAL BETWEEN ADDITIVE DISPOSED ON A TOP SURFACE AND A CAVITY SURFACE OF A WORKPIECE USING AN EXTERNAL INFLUENCE

This application relates to and claims benefit from application Ser. No. 60/224,739 filed Aug. 10, 2000.

FIELD OF THE INVENTION

The present invention relates generally to a semiconductor plating method and apparatus. More particularly, the present invention is directed to a method and apparatus that creates a differential between additive adsorbed on a top surface of a workpiece and additive adsorbed within a cavity portion of the workpiece using an external influence to enhance plating of a conductive material in the cavity portion of the workpiece.

BACKGROUND OF THE INVENTION

There are many steps required in manufacturing multi-level integrated circuits (IC). Such steps include depositing conductive and insulator materials on a semiconductor wafer or substrate followed by full or partly removal of these materials using photo-resist patterning, etching, and the like. After photolithography, patterning and etching steps, the resulting surface is generally non-planar as it contains many cavities or features such as vias, lines, trenches, channels, bond-pads, and the like that come in a wide variety of dimensions and shapes. These features are typically filled with a highly conductive metal material before additional processing steps such as etching and/or chemical mechanical polishing (CMP) is/are performed. Accordingly, a low resistance interconnection structure is formed between the various levels/sections of the IC.

Copper (Cu) is quickly becoming the preferred material for interconnections in ICs because of its low electrical resistively and high resistance to electro-migration. Electrodeposition is one of the most popular methods for depositing Cu into the features on the substrate surface.

As can be expected, there are many different designs of Cu plating systems that have been used in this industry. For example, U.S. Pat. No. 5,516,412 issued on May 14, 1996, to Andricacos et al. discloses a vertical paddle plating cell that is designed to electrodeposit a film on a flat article. Next, U.S. Pat. No. 5,985,123 issued on Nov. 16, 1999, to Koon discloses yet another vertical electroplating apparatus, which purports to overcome the non-uniform deposition problems associated with varying substrate sizes. Further, U.S. Patent No. 5,853,559 issued on Dec. 29, 1998, to Tamaki et al. discloses an electroplating apparatus that minimizes waste of the plating electrolyte and accomplishes high recovery of the electrolyte.

During the Cu electrodeposition process, specially formulated plating solutions or electrolyte are used. These solutions or electrolyte contain ionic species of Cu and additives to control the texture, morphology, and the plating behavior of the deposited material. Additives are needed to make the deposited layers smooth and somewhat shiny.

There are many types of Cu plating solution formulations, some of which are commercially available. One such formulation includes Cu-sulfate ($CUSO_4$) as the copper source (see James Kelly et al., Journal of The Electrochemical Society, Vol. 146, pages 2540–2545, (1999)) and includes water, sulfuric acid ($H_2SO_4$), and a small amount of chloride ions. As is well known, other chemicals can be added to the Cu plating solution to achieve desired properties of the deposited material.

The additives in the Cu plating solution can be classified under several categories such as suppressors, levelers, brighteners, grain refiners, wetting agents, stress-reducing agents, accelerators, etc. In many instances, different classifications are often used to describe similar functions of these additives. Today, solutions used in electronic applications, particularly in manufacturing ICs, contain simpler additives consisting of two-component two-ingredient packages (e.g., see Robert Mikkola and Linlin Chen, "Investigation of the Roles of the Additive Components for Second Generation Copper Electroplating Chemistries used for Advanced Interconnect Metallization", Proceedings of the International Interconnect Technology Conference, pages 117–119, Jun. 5–7, 2000). These formulations are generically known as suppressors and accelerators.

Suppressors are typically polymer formulated from polyethylene glycol-PEG or polypropylene glycol-PPG and is believed to attach themselves to the substrate surface at high current density regions, thereby forming a high resistance film and suppressing the material deposited thereon. Accelerators are typically organic disulfides that enhance Cu deposition on portions of the substrate surface where they are adsorbed. The interplay between these two additives and possibly the chloride ions determines the nature of the Cu deposit.

The following figures are used to more fully describe the conventional electrodeposition method and apparatus. FIG. 1 illustrates a perspective view of a cross-section of a substrate 3 having an insulator 2 formed thereon. Using conventional etching techniques, features such as a row of small vias 4a and a wide trench 4b are formed on the insulator 2 and the substrate 3. In this example, the vias 4a are narrow and deep; in other words, they have high aspect ratios (i.e., their depth to width ratio is large). Typically, the widths of the vias 4a are sub-micron. The trench 4b, on the other hand, is typically wide and has a small aspect ratio. In other words, the width of the trench 4b may be five to fifty times or more greater than its depth.

FIGS. 2a–2c illustrate a conventional method for filling the features with Cu. FIG. 2a illustrates a cross sectional view of the substrate 3 in FIG. 1 having various layers disposed thereon. For example, this figure illustrates the substrate 3 and the insulator 2 having deposited thereon a barrier/glue or adhesion layer 5 and a seed layer 6. The barrier layer 5 may be tantalum, nitrides of tantalum, titanium, tungsten, or TiW, etc., or combinations of any other materials that are commonly used in this field. The barrier layer 5 is generally deposited using any of the various sputtering methods, by chemical vapor deposition (CVD), or by electroless plating methods. Thereafter, the seed layer 6 is deposited over the barrier layer 5. The seed layer 6 material may be copper or copper substitutes and may be deposited on the barrier layer 5 using various sputtering methods, CVD, or electroless deposition or combinations thereof.

In FIG. 2b, after depositing the seed layer 6, a conductive material 7 (e.g., copper layer) is generally electrodeposited thereon from a suitable acidic or non-acidic plating bath or bath formulation. During this step, an electrical contact is made to the Cu seed layer 6 and/or the barrier layer 5 so that a cathodic (negative) voltage can be applied thereto with respect to an anode (not shown). Thereafter, the Cu material 7 is electrodeposited over the substrate surface using the specially formulated plating solutions, as discussed above. By adjusting the amounts of the additives, such as the chloride ions, suppressor/inhibitor, and the accelerator, it is possible to obtain bottom-up Cu film growth in the small features.

The Cu material 7 completely fills the via 4a and is generally uniform in the large trench 4b, but does not completely fill the trench 4b because the additives that are used are not operative in large features. For example, it is believed that the bottom up deposition into the via 4a occurs because the suppressor/inhibitor molecules attach themselves to the top of the via 4a to suppress the material growth thereabouts. These molecules can not effectively diffuse to the bottom surface of the via 4a through the narrow opening. Preferential adsorption of the accelerator on the bottom surface of the via 4a results in faster growth in that region, resulting in bottom-up growth and the Cu deposit profile as shown in FIG. 2b. Without the appropriate additives, Cu can grow on the vertical walls as well as the bottom surface of the via 4a at the same rate, thereby causing defects such as seams and/or voids.

Adsorption characteristics of the suppressor and accelerator additives on the bottom surface of the large trench 4b is not expected to be any different than the adsorption characteristics on the top surface of the field regions 8 of the substrate. Therefore, the Cu thickness t1 at the bottom surface of the trench 4b is about the same as the Cu thickness t2 over the field regions 8.

As can be expected, to completely fill the trench 4b with the Cu material 7, further plating is required. FIG. 2c illustrates the resulting structure after additional Cu plating. In this case, the Cu thickness t3 over the field regions 8 is relatively large and there is a step $S_1$ from the field regions 8 to the top of the Cu material 7 in the trench 4b. For IC applications, the Cu material 7 needs to be subjected to CMP or other material removal process so that the Cu material 7 as well as the barrier layer 5 in the field regions 8 are removed, thereby leaving the Cu material 7 only within the features. These removal processes are known In be quite costly.

Thus far, much attention has been focused on the development of Cu plating chemistries and plating techniques that yield bottom-up filling of small features on substrates. This is necessary because, as mentioned above, lack of bottom-up filling can cause defects in the small features. As part of these development efforts, it was discovered that the filling behavior of the small features could be affected not only by the solution chemistry, but also by the type of the power supply used for electrodeposition.

Recent studies suggest that it might be preferable to use pulse or pulse-reverse plating methods to deposit defect free Cu into the small vias (e.g., U.S. Pat. No. 5,972,192 issued to Dubin et al. on Oct. 26, 1999, and Gandikota et al. "Extension of Copper Plating to 0.13 um Nodes by Pulse-Modulated Plating", Proceedings of the International Interconnect Technology Conference, pages 239–241, Jun. 5–7, 2000). In the pulse-reverse plating process, a cathodic voltage pulse rather than a cathodic DC voltage is applied to the substrate surface. After a short period of plating during the cathodic pulse, the polarity of the voltage is reversed for a brief period causing electrochemical etching from the deposited material. Plating and etching cycles are then repeated until the small features are filled with high quality Cu. A recent study (e.g., C. H. Hsieh et al., "Film Properties and Surface Profile after Gap Fill of Electrochemically Deposited Cu Films by DC and Pulse Reverse Processes", Proceedings of the International Interconnect Technology Conference, pages 182–184, Jun. 5–7, 2000), shows that the filling of the vias is controlled mainly by the additive diffusion when the DC process is used, whereas it is mainly controlled by additive adsorption when a pulse-reverse process is used.

As described above, the attention in the semiconductor industry has mainly been concentrated on filling the various features on semiconductor wafers with Cu. Both DC and pulsed power supplies have been used in the deposition of these Cu films. Filling properties of Cu into small features was found to be a strong function of the type of the power supply used. Although the exact roles of the plating solution additives and their interaction with the applied voltage waveforms are not well understood, it is clear that the kinetics of the additive adsorption and diffusion processes influence the way metals deposit on non-planar substrate surfaces.

As mentioned above, special bath formulations and pulse plating processes have been developed to obtain bottom-up filling of the small features. However, these techniques have not been found effective in filling the large features. In large features, the additives can freely diffuse in and out of them. The use of standard pulse plating techniques in conjunction with the commonly used additive systems containing chloride ions, accelerators and suppressors/inhibitors do not yield accelerated growth from the bottom surface of the features where the width of the feature is considerably larger than its depth. The growth of Cu in such features is conformal and the film thickness deposited on the bottom surface of the large features is approximately the same as that deposited on the field regions.

Methods and apparatus to achieve accelerated bottom-up plating in small as well as large features on a substrate would be invaluable in terms of process efficiency and cost since such a process would yield a Cu deposit that is generally planar as illustrated in FIG. 3. The Cu thickness t5 over the field regions 8 in this example is smaller than the traditional case as shown in FIG. 2c, and the step height $S_2$ would also be much smaller. Removal of the thinner Cu layer in FIG. 3 by CM P or other methods would be easier, providing important cost savings.

Others have previously recognized attractive features of a plated Cu structure such as the one shown in FIG. 3. For example, in a PCT application ("Electroplated Interconnection Structures on Integrated Circuit Chips", WO 98/27585, Jun. 25, 1998) researchers from International Business Machines Corporation state that the plating processes described therein produce super-filling of only the sub-micron size cavities when plating was carried out in a conventional plating cell. However, it also states that a further benefit could be realized when a cup plating cell is used as described in U.S. Pat. No. 4,339,319 issued on Jul. 13, 1982, to Aigo. In addition, when the substrate surface was held in contact with the meniscus of the electrolyte during plating in a cup plating cell, cavities of greatly different widths could be filled rapidly at the same rate yielding a structure similar to that shown in FIG. 3. The PCT application also mentions that superior performance of the meniscus plating approach was due to the higher concentration of the surface active additive molecules at the air-liquid interface.

In U.S. Pat. No. 6,176,922 for Method and apparatus for electrochemical mechanical deposition", commonly owned by the assignee of the present invention, a technique is disclosed that achieves deposition of the conductive material into the cavities on the substrate surface while minimizing deposition on the field regions by polishing the field regions with a pad as the conductive material is deposited. The plating electrolyte in this application is supplied to the small gap between the pad and the substrate surface through a porous pad or through asparities in the pad.

FIG. 4 shows a schematic depiction of an electrochemical mechanical deposition apparatus that can be used for planar or near-planar Cu deposition on a semiconductor wafer. A carrier head 10 holds a semiconductor wafer 16 and provides an electrical lead 17 connected to the conductive portion of the wafer 16. The head 10 can be rotated clockwise or counter-clockwise about a first axis 10b and can be moved in x, y, and z directions. A pad 18 is provided on top of an anode assembly 19, which pad 18 faces the wafer 16. An electrolyte 20 containing the plating material is applied to the wafer 16 surface using the anode assembly 19. The electrolyte 20 can be flowed through the holes/openings in the pad 18, which makes physical contact with the wafer 16 surface. The electrolyte 20 then flows in the narrow gap between the wafer 16 and the pad 18, eventually flowing over the edges of the pad 18 into a chamber 22 to be re-circulated (not shown) after cleaning/filtering/refurbishing. A second electrical lead 24 is connected to the anode assembly 19. Any other known method for providing the electric potentials to the anode assembly 19 and cathode wafer 16 can be used herein.

The anode assembly 19 can also be rotated around a second axis 10c at controlled speeds in both the clockwise and counter-clockwise directions. It is also understood that axes 10b and 10c are substantially parallel to each other. The gap between the wafer 16 and the pad 18 is adjustable by moving the carrier head 10 in the z direction. When the wafer 16 surface and the pad 18 are in contact, the pressure that is exerted on the two surfaces can also be adjusted. The co-pending U.S. application Ser. No. 09/511,278, entitled "Pad Designs and Structures for a Versatile Materials Processing Apparatus", filed Feb. 23, 2000, now U.S. Pat. No. 6,413,388, describes various shapes and forms of the holes in the pad 8, through which the electrolyte flows to the wafer surface.

During operation, a potential is applied between the electrical lead 17 to the wafer 16 and the electrical lead 24 to the anode assembly 19, making the wafer 16 surface more negative than the anode assembly 19. The electrolyte 20 can be introduced to the pad 18 from a reservoir (not shown) located in proximity to the anode assembly 19. The anode assembly 19 can have an in-channel and holes that are made therein, which together provide a path for the electrolyte 20 to be fed to the gap between the pad 18 and the wafer 16.

Under applied potential, Cu plates out of the electrolyte 20 onto the wafer 16 surface. The moving pad 18 that is pushed against the wafer 16 surface at a controlled pressure minimizes accumulation of Cu over certain portions of the wafer 16 surface by polishing the same.

The pad 18 is preferably nonconductive, hard, porous, or perforated type material so that an electric field can pass through it, while preventing shorting between the anode assembly 19 and the cathode wafer 16. The spacing or gap between the pad 18 and the cathode wafer 16 may range from less than 1 micron up to 2 millimeter. The diameter or cross sectional length of the pad 18 and the wafer 16 may range from about 5 millimeter to over 300 millimeter. The larger the wafer 16 diameter, the larger the pad 18 diameter.

SUMMARY OF THE INVENTION

It is an object of the present invention to provide a method and apparatus that plates a conductive material on a substrate surface in a highly desirable manner.

It is another object of the present invention to provide a method and apparatus that plates a conductive material in both small and large features of a substrate surface with greater efficiency, cost-savings, and superior quality than prior art methods and apparatus.

It is a further object of the present invention to provide a method and apparatus that plates a conductive material in small and large features on a substrate surface using a mask having one or more opening therein.

It is yet another object of the present invention to provide a method and apparatus that plates a conductive material in small and large features while electrical power is locally pulsed on the substrate surface due to the movement of the opening(s) in the mask with respect to the substrate surface.

It is a further object of the present invention to provide a method and apparatus that removes additive that has been previously adsorbed onto the top surface portion of a workpiece in order to enhance the plating of a conductive material on a cavity feature surface portion of the workpiece that did not have previously adsorbed additive removed.

It is yet another object of the present invention to create a differential between additive adsorbed on a top surface of a workpiece and additive adsorbed within a cavity portion of the workpiece to enhance plating of a conductive material in the cavity portion of the workpiece.

The above objects of the invention, among others, taken alone or in combination, are achieved by the present invention, which provides an apparatus for, and a method of, plating a conductive material on the surface of a workpiece.

In one aspect of the method, an electrolyte solution with at least one additive disposed therein is applied over the workpiece, such that the additive becomes adsorbed onto the top portion and the cavity portion of the workpiece. An external influence is applied so that the additive adsorbed onto the top surface is removed, and plating of the conductive material take place before the additive fully re-adsorbs onto the top portion, thereby causing greater plating of the cavity portion relative to the top portion.

In another aspect of the method, an electrolyte solution with at least one additive disposed therein is applied over the workpiece, such that the additive becomes adsorbed onto the top portion and the cavity portion of the workpiece. An external influence is applied so that a differential in the amount of additive that is adsorbed on the top portion relative to the cavity portion is achieved. Plating takes place while the differential still exists, thereby causing greater plating of the cavity portion relative to the top portion.

In one aspect of the apparatus, a mask disposed between an anode and the workpiece and is movable with respect to the workpiece physically sweeps a top portion of the workpiece, thereby reducing additive adsorbed thereon, while additive adsorbed on a cavity portion remains. An anode that assists in creating an electric field between it and the workpiece is used to promote plating of the conductor within the electrolyte that is disposed over the workpiece.

In another aspect of the apparatus, the mask contains an open area that is used to help define where the electric field will exist, thus allowing greater control over where plating will occur on the workpiece.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

The preferred embodiments of the present invention will now be described with reference to the following figures. The inventors of the present invention have found that by mask-pulse plating the conductive material on the substrate surface, a more desirable and high quality conductive material can be deposited in the various features therein.

The present invention can be used with any substrate such as a semiconductor wafer, flat panel, magnetic film head, packaging substrate, and the like. Further, specific processing parameters such as time, pressure, mask designs, and the like are provided herein, which specific parameters are intended to be explanatory rather than limiting.

The plating method described herein is called "mask-pulsed" plating. The present invention describes a method and apparatus for mask-pulse plating the conductive material onto the substrate by intermittently moving the mask to make contact with the substrate surface and applying power between an anode and the substrate, the mask being positioned in between the anode and the substrate. Furthermore, the present invention is directed to novel plating method and apparatus that provide enhanced electrodeposition of conductive materials into the various features on the substrate surface.

Figure 5:
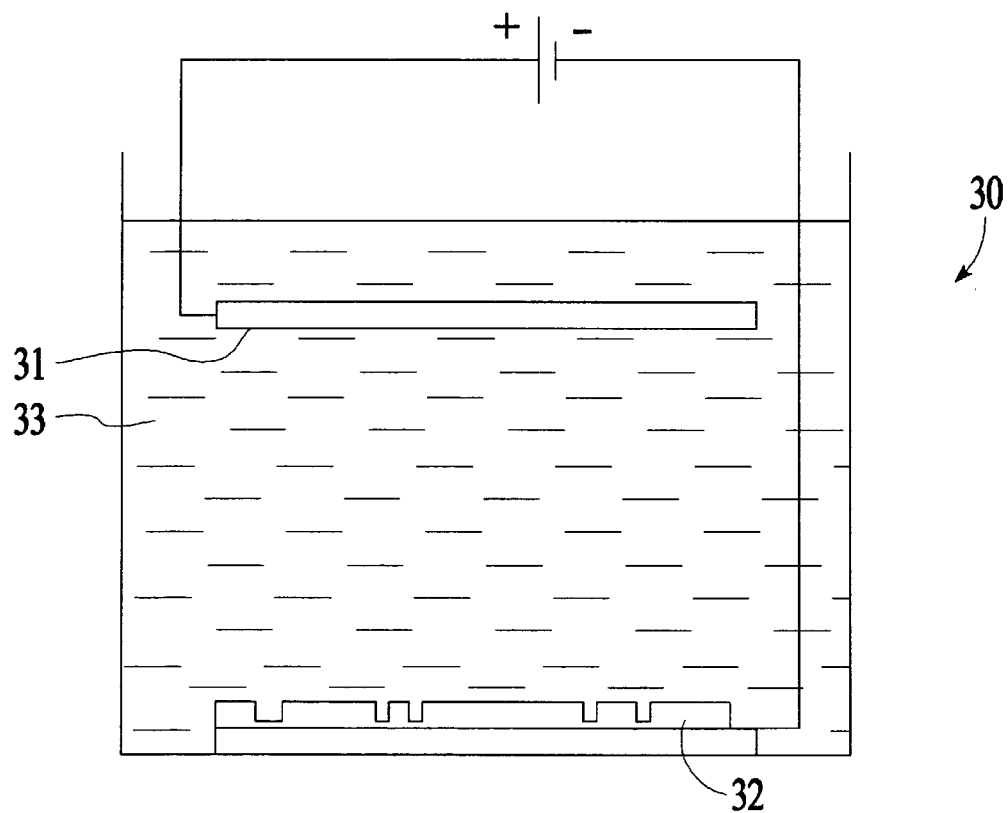
FIG. 5 illustrates a conventional plating cell having an anode, cathode, and electrolyte disposed therein.

FIG. 5 illustrates a plating cell 30 having therein an anode 31, a cathode 32, and an electrolyte 33. It should be noted that the plating cell 30 is a conventional cell and the exact geometry of the plating cell used in the present invention can vary. The electrolyte 33 is in contact with the top surface of the cathode 32. The cathode 32 in the examples provided herein is a wafer (substrate) having various features on its top surface. When a DC or pulsed voltage is applied between the wafer 32 and the anode 31, Cu from the electrolyte 33 is deposited on the wafer 32 as described above. The differences between the DC or pulsed power determines the quality of the Cu that is filled in the small features.

Figure 6:
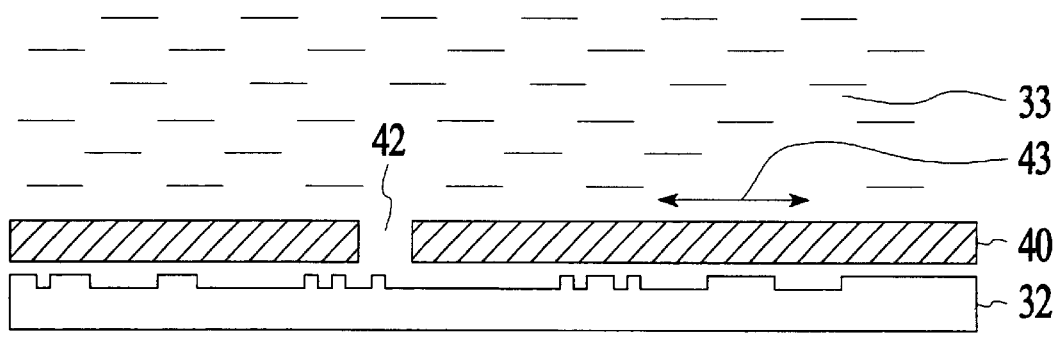
FIG. 6 illustrates a partial view of an apparatus in accordance with the preferred embodiment of the present invention.

FIG. 6 illustrates a preferred embodiment of the present invention. In the present invention, a mask 40 is positioned in close proximity to the cathode wafer 32, where the mask 40 includes an opening 42 through which the electrolyte 33 makes physical contact with a section of the wafer 32. For ease of understanding and explanation, FIG. 6 does not illustrate the electrical connections, the anode, and the plating cell containing the electrolyte 33. When an appropriate voltage is applied between the cathode wafer 32 and the anode, the opening 42 allows the Cu from the electrolyte 33 to be plated onto the surface of the substrate 32 directly below the opening 42. If the mask 40 makes physical contact with the cathode wafer 32, then the plating would largely be limited to the area of the substrate directly underneath the opening 42. When the mask 40 is moved in a side to side motion as indicated by arrow 43, the electrical current passing through a section on the wafer surface will vary. This is discussed in greater detail later herein.

Figure 7A:
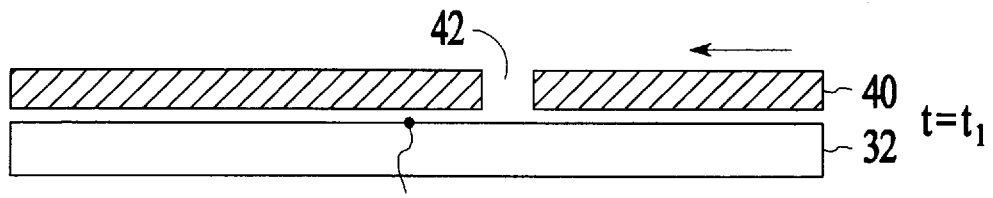
FIGS. 7a–7d illustrate a mask pulsed plating method in accordance with the preferred embodiment of the present invention.

FIGS. 7a–7d illustrate a mask pulsed plating method in accordance with the preferred embodiment of the present invention. The mask 40 is moved to the left with respect to the cathode wafer 32 (or alternatively, the wafer 32 may be moved to the right, or both the mask 40 and the wafer 32 may be moved relative to each other). In FIG. 7a, at time t=$t_1$, a section 45 on the wafer 32 surface is positioned under the electrically insulating mask 40 and is not directly exposed to the electrolyte. Accordingly, the plating current at the section 45 at t=$t_1$ is very small or near zero as depicted in the graph of FIG. 7e. FIG. 7e illustrates a graph depicting the deposition/plating current in relation to time at the section 45.

Figure 7B:
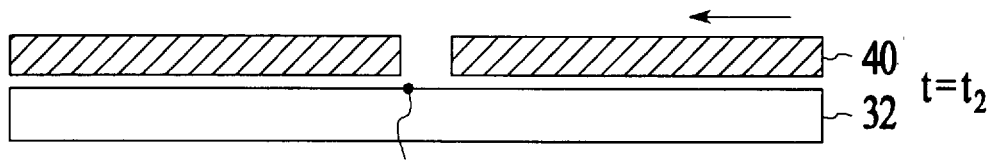
Figure 7C:
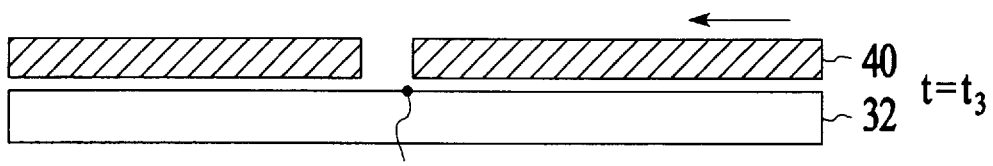
Figure 7D:
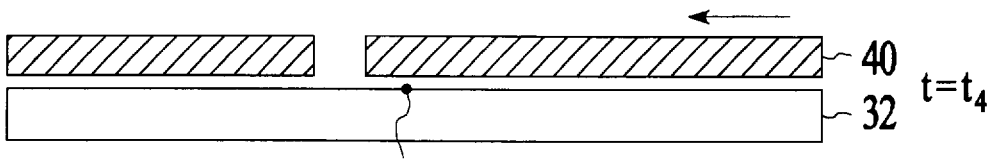
Figure 7E:
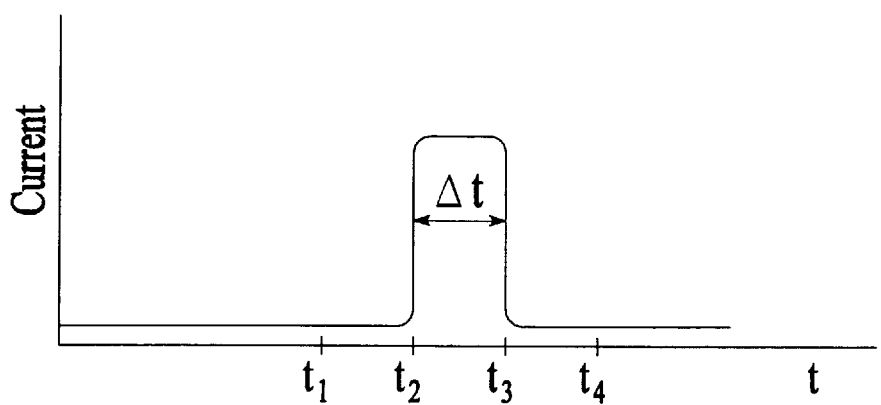
FIG. 7e illustrates a graph corresponding to FIGS. 7a–7d in accordance with the preferred embodiment of the present invention.

In FIG. 7b, as the mask 40 and/or the wafer 32 is moved such that the opening 42 is above the section 45, the plating current at the section 45 at time t=$t_2$ increases sharply as the opening 42 aligns with the section 45. In FIG. 7c, the high current remains steady until t=$t_3$. Thereafter, when the section 45 is again positioned underneath the non-opened portion of the mask 40 as shown in FIG. 7d, the current density is again very small or near zero.

Referring back to FIG. 7e, the time interval Δt (time between $t_2$ and $t_3$) is a function of the speed of the mask 40 as well as the size of the opening 42. In addition, Δt will be a small value if the mask 40 is moved rapidly in relation to the wafer 32. Also, if there are multiple openings in the mask 40 or if the movement of the mask 40 is back and forth, then the corresponding current vs. time plots would consist of multiple pulses. By controlling the size of the opening(s) on the mask 40 and the relative speed of the substrate and the mask, the shape, duration and repetition rate of the current pulses at any section on the substrate can be controlled.

As can be seen from the above example, a DC power supply can be used for this plating technique. By moving the solid insulating mask 40 that makes physical contact with the wafer 32, any section on the wafer surface can be suddenly and briefly exposed to the electrolyte and to the applied plating current. This is quite different from the prior art techniques defined above. For instance, in the present invention, certain sections of the wafer surface are substantially free from the electrolyte. The electrolyte is applied to a section of the wafer only when that section is exposed to the electrolyte and a pulse of current is simultaneously applied.

If the current mask-pulsed plating method is used with simple metal deposition electrolytes with no additives (i.e., inhibitors and accelerators), it would not be expected to be much different than conventional plating. This is because the size of the openings 42 in the mask 40 is much larger than the feature size on the wafer 32 surface. Therefore, when a section is exposed through the opening 42 to the electrolyte, regular plating would commence. However, if additives are added that influence polarization, then the mask-pulsed plating method can offer advantages that is not existent in conventional pulsed plating techniques.

For example, consider a Cu plating bath containing conventional solutions/chemicals (Cu sulfate, water, sulfuric acid and chloride ions) and an additive A. The additive A enhances deposition when it is adsorbed on the wafer surface. When this electrolyte is used in a conventional plating cell such as the one depicted in FIG. 5, the entire surface of the wafer 32 will be exposed to the electrolyte and the additive A. The field regions on the wafer surface, as well as the bottom surface of the large features would likewise adsorb the additive A and plating begins on these surfaces at comparable rates.

If, however, the mask-pulsed plating technique is used with the same electrolyte, the mask would clear away the additive A from the field regions since it makes physical contact with these regions. Both the small and large features, however, will still contain the adsorbed additive A since these features are not in direct physical contact with the mask. When a section of the wafer is suddenly exposed to the electrolyte, the bottom and side surfaces of the features with the previously adsorbed additive A would immediately start plating at a higher rate than the field regions. If the time period $\Delta t$ is less than the adsorption period required for the additive A to attach itself to the substrate surface, the applied plating current preferentially flows through the features to be filled, thereby yielding an enhanced deposition rate within the features in relation to the deposition rate on the field regions.

The mask-pulsed plating method of the present invention utilizes the differences between response times of various additives to achieve enhanced plating into the various features of the substrate surface. The mechanism involves "sweeping" of the top surface of the substrate (field regions) by the mask, which does not make physical contact with the regions inside the features. The sweeping on the field regions establishes a differential between the concentration of the adsorbed species in those regions that are swept away and the regions that are within the features. When the surface is then suddenly exposed to the electrolyte and the electric field, the features with the adsorbed species attracts most of the plating current from the field regions.

This present method works equally well using multiple additives. For example, if the plating solution contains an inhibitor B and an accelerator C with the adsorption kinetics of the inhibitor being much faster than that of accelerator, the following mechanism can be used by the mask-pulsed plating method. Both the inhibitor B and the accelerator C would be partially or wholly swept off the field regions of the substrate by the mask. However, both species would still be present in the features. When the substrate is exposed to the electrolyte and the electric field, the inhibitor B would readily adsorb onto the field regions introducing a high resistance path for the plating current. The accelerator C, which is already present within the features, compensates for the action of the inhibitor in those regions and the current can easily flow through these features. Therefore, until the accelerator C is properly adsorbed onto the field regions, the film growth rate within the features will be higher.

This same result can also be expected from yet another chemistry where an inhibitor D has the property of strong adsorption and the accelerator E is weakly bonded to the field regions. In this case, the mask can readily remove the weakly bonded accelerator E from the field regions whereas, the accelerator E remains attached to the surfaces within the features. Upon exposure to the electrolyte and electric field, the plating current flows through the features preferentially until the accelerator E begins to get adsorbed again onto the field regions.

It should be noted that the above descriptions are just some examples of the mechanisms involved in the present invention and are not meant to be limiting. The present invention utilizes differences between adsorption/desorption kinetic of various electrolyte additives. The present invention accomplishes this by applying a solution and power suddenly and simultaneously to a specific section of the substrate surface that has been previously cleared off, partially or wholly, of one or more of the additive species.

The geometry of the plating system shown in FIG. 6 is quite simplistic. There are many possible designs that can be used to practice this invention. Some important aspects of the present invention are as follows.

(1) The mask needs to be flat when using a wafer that is also flat. The mask should be made of an insulating rigid material and the surface facing the wafer may be hard and even contain abrasives to help "sweep" away the additives more efficiently.

(2) There should be a relative movement between the wafer and the mask. The wafer, mask, or both may be moved in linear or orbital manner or combination thereof.

(3) There should be substantially no electrolyte between the mask and the wafer surface. The wafer surface should be exposed to electrolyte only through the opening(s) in the mask.

(4) The size of the opening(s) in the mask and the speed of the relative motion between the mask and the wafer should be such that any section on the wafer should be exposed to the electrolyte only briefly, typically for less than two seconds, preferably less than one second, e.g., 10–500 msec. This time interval should be adjusted with respect to the adsorption characteristics of the additives being used.

Figure 8:
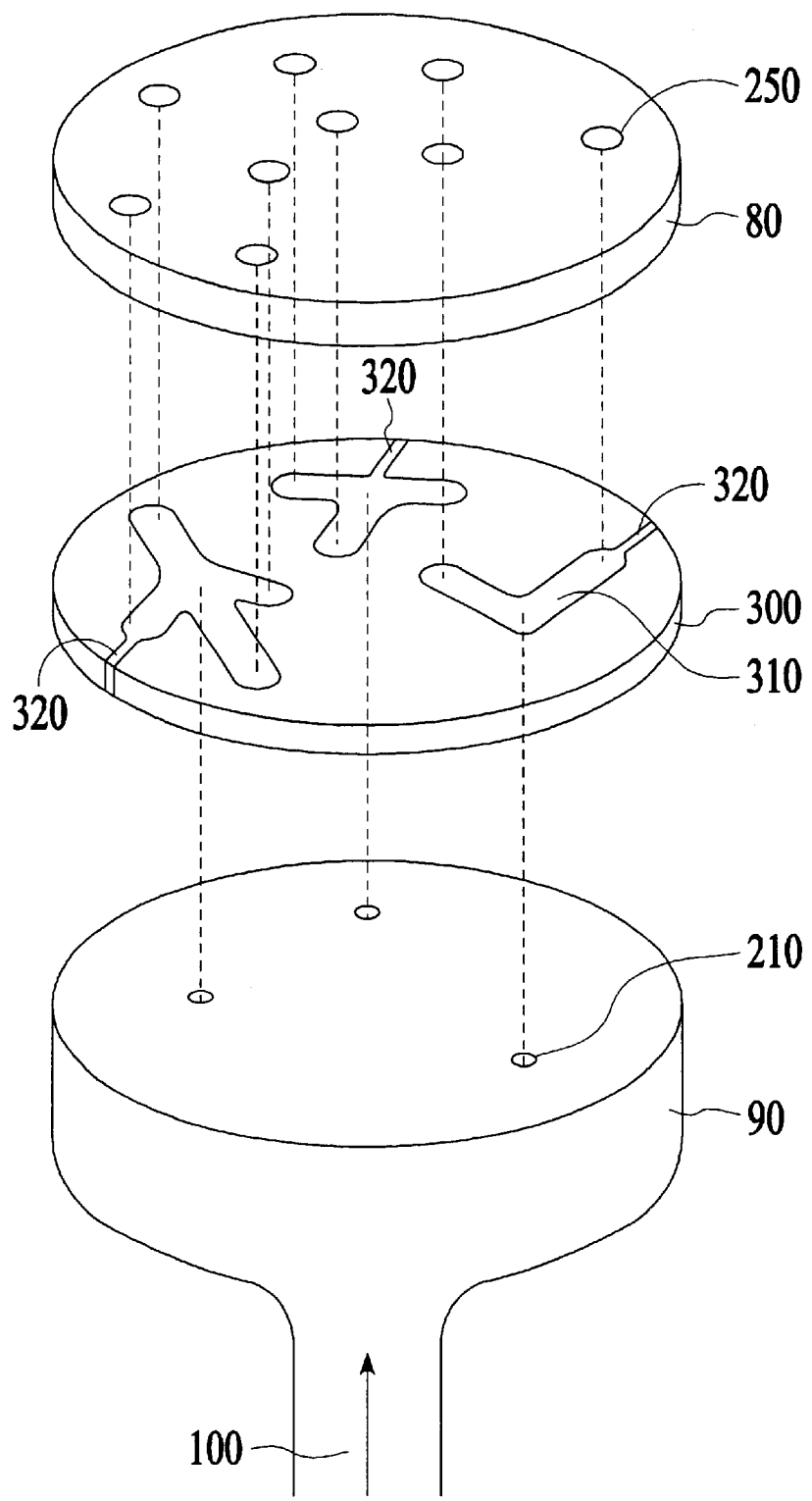
FIG. 8 illustrates a perspective view of an apparatus in accordance with the first preferred embodiment of the present invention.

FIG. 8 illustrates a perspective view of an apparatus in accordance with the first preferred embodiment of the present invention. In FIG. 8, a mask 80 and an electrolyte channel plate 300 are mounted on an anode assembly 90. The electrolyte 100 is supplied to the anode assembly 90 by a pumping conventional system (not shown). The electrolyte 100 is pumped through the holes 210 into the channels 310 in the channel plate 300. In operation, the substrate/cathode is positioned facing the top surface of the mask 80 and the substrate and/or the mask 80 is/are rotated. The substrate may be pushed against the mask 80 at a pressure in the range of 0.01 psi and 0.5 psi. Higher pressures may be used, but may not be necessary. If the mask 80 is rotated, the entire anode assembly 90 may likewise be rotated. A cathodic voltage is applied to the substrate (not shown) with respect to an anode (not shown) placed within the anode assembly 90. The electrolyte 100 flowing through the channels 310 make physical contact with the wafer surface through the openings 250 in the mask 80. The electrolyte 100 is continuously discharged from the small bleeding holes 320 to be filtered and re-circulated. Very little, if any electrolyte actually get into the interface between the mask 80 and the wafer surface, which are in intimate contact during operation.

Figure 9:
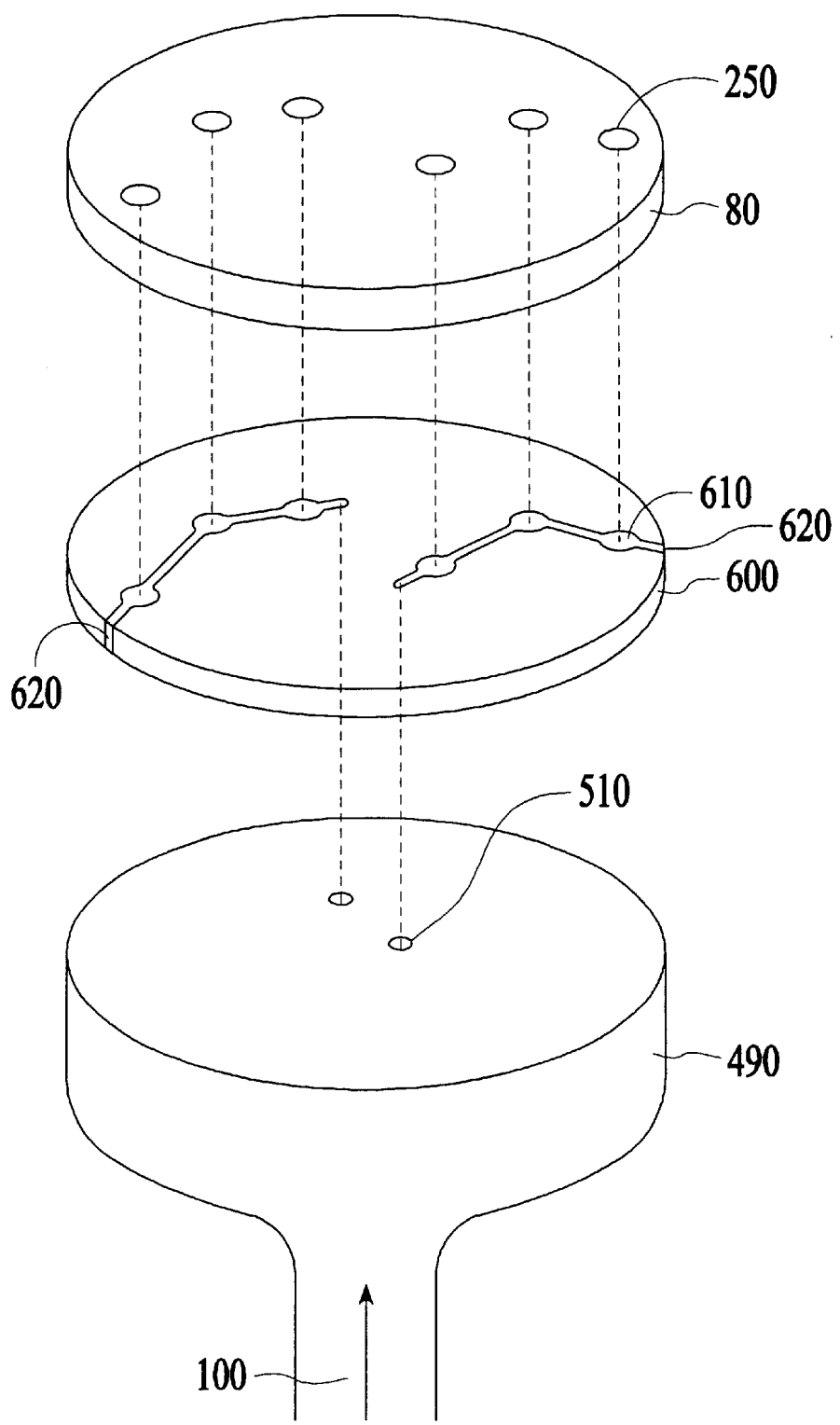
FIG. 9 illustrates a perspective view of an apparatus in accordance with the second preferred embodiment of the present invention.

FIG. 9 illustrates a perspective view of an apparatus in accordance with the second preferred embodiment of the present invention. The apparatus in FIG. 9 is similar to that shown in FIG. 8, except for the holes 510 and the channel plate 600. The channel plate 600 includes different shaped channels 610, which are used to distribute the electrolyte 100 in a serial manner to the openings 250 of the mask 80.

Figure 10:
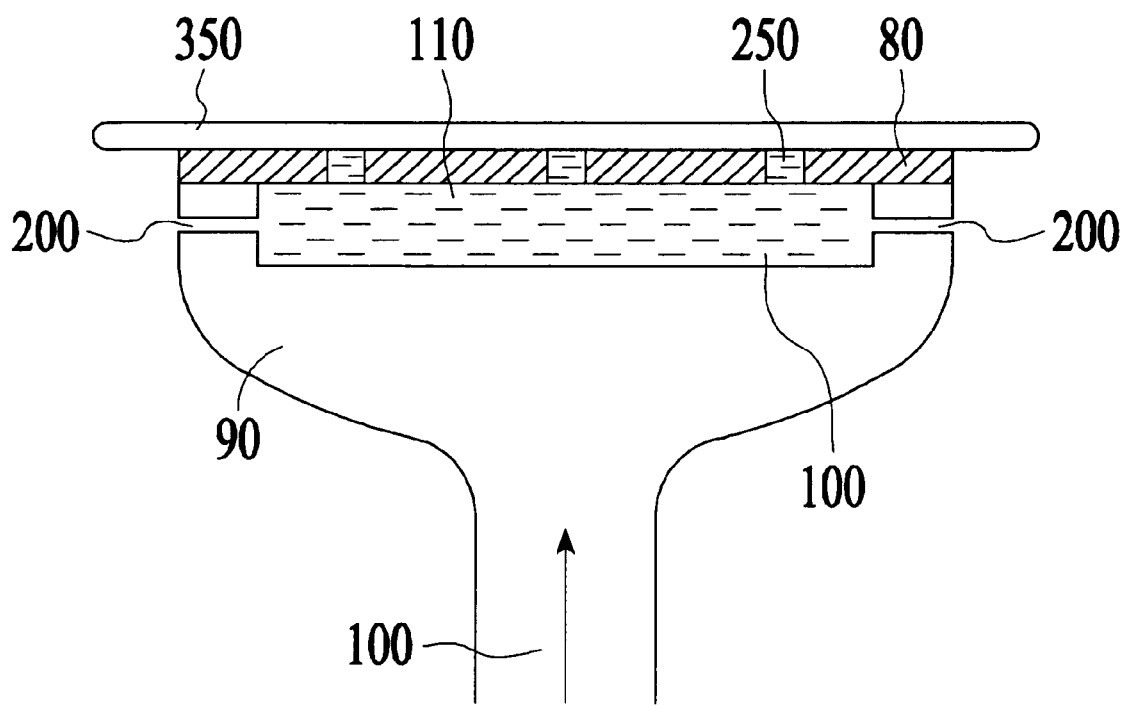
FIG. 10 illustrates a side view of an apparatus in accordance with the third preferred embodiment of the present invention.

FIG. 10 illustrates a side view of an apparatus in accordance with the third preferred embodiment of the present invention. In yet another embodiment, FIG. 10 shows the electrolyte 100 coming into a reservoir 110 that resides on the top portion of the anode assembly 90. The electrolyte 100 makes contact with the surface of the wafer 350 through holes 250 in the mask 80. The electrolyte can be discharged from the reservoir 100 through bleeding holes 200.

The power supply used in the present invention may be pulsed or DC power supply, but preferably it is a DC power supply. The power supply can be used in the current controlled or voltage controlled mode, i.e., it either keeps the applied current constant or applied voltage constant. For the case of using a current controlled mode, it is important that the size of the opening(s) in the mask be large enough to cover portions of the field regions as well as portions of the features simultaneously. In other words, when the wafer surface is exposed to the electrolyte through the opening(s), there should not be just the field regions that are exposed to the electrolyte at any given time. For example, if the opening is very small or the number of features on the wafer surface is low (low density features), the field regions are exposed to the electrolyte. In this case, since the power supply pushes through a fixed current, all the current would flow through the field regions and the Cu will be plated on the field region without discrimination. But if both field regions and features are exposed simultaneously, then the current would preferentially flow through the features and more Cu would be plated into the features and less on the field regions. This situation can be assured by increasing the number of openings in the mask so that there are always portions of the both regions (field and feature) exposed through some of the holes simultaneously.

If a constant voltage power supply is used, then the current automatically adjusts itself depending upon the resistance on the wafer surface. Therefore, if the mask hole exposes only the field regions of the wafer, less current is supplied to that surface and the plating amount is smaller. When features are exposed to the solution, more current flows into the feature and thus preferential plating takes place into the features. Therefore, it is more appropriate to use voltage controlled mode of the power supply if wafers with low feature density is coated and/or the number of holes in the mask is limited.

Figure 1:
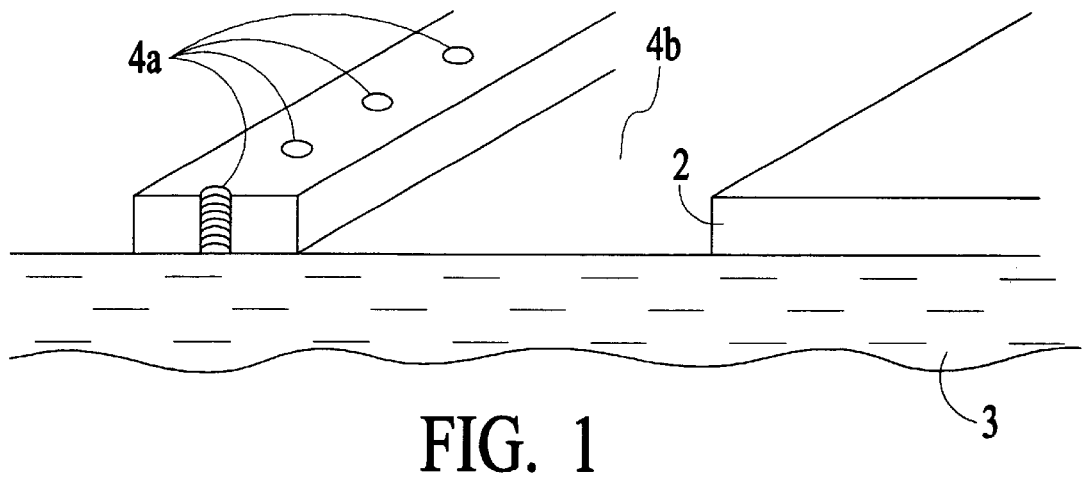
FIG. 1 illustrates a perspective view of a cross section of a substrate having an insulator layer and various features formed thereon.
Figure 2A:
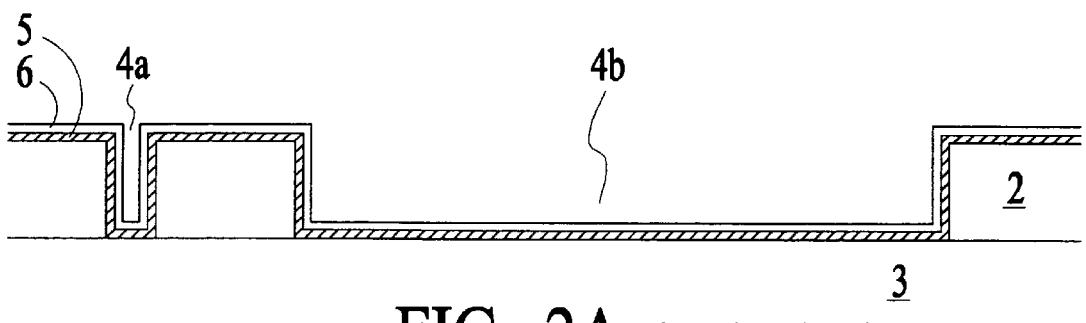
FIGS. 2a–2c illustrate cross sectional views of a conventional method for depositing a conductive material on the substrate of FIG. 1.
Figure 2B:
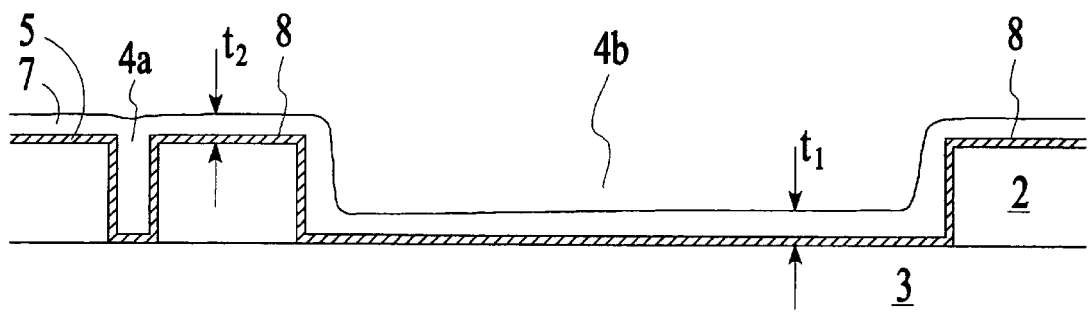
Figure 2C:
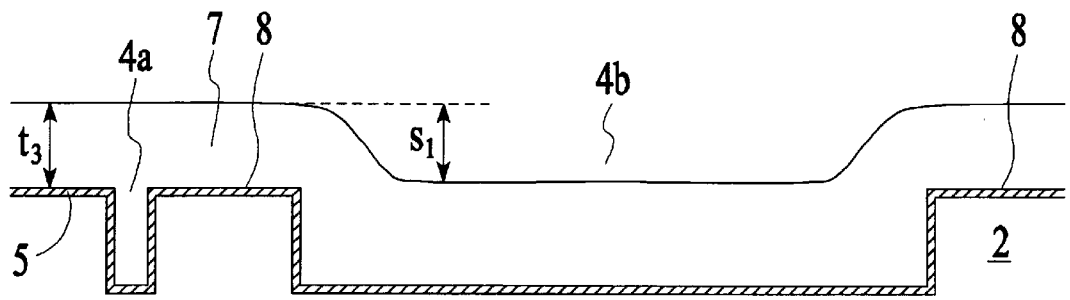
Figure 3:
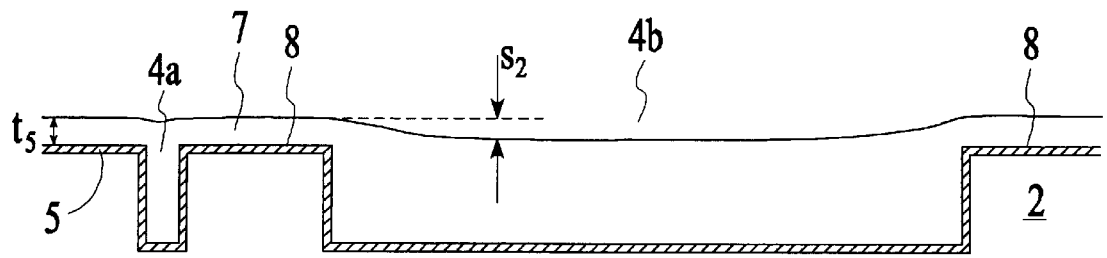
FIG. 3 illustrates a cross sectional view of a substrate having a conductive material deposited thereon in accordance with another conventional method.
Figure 4:
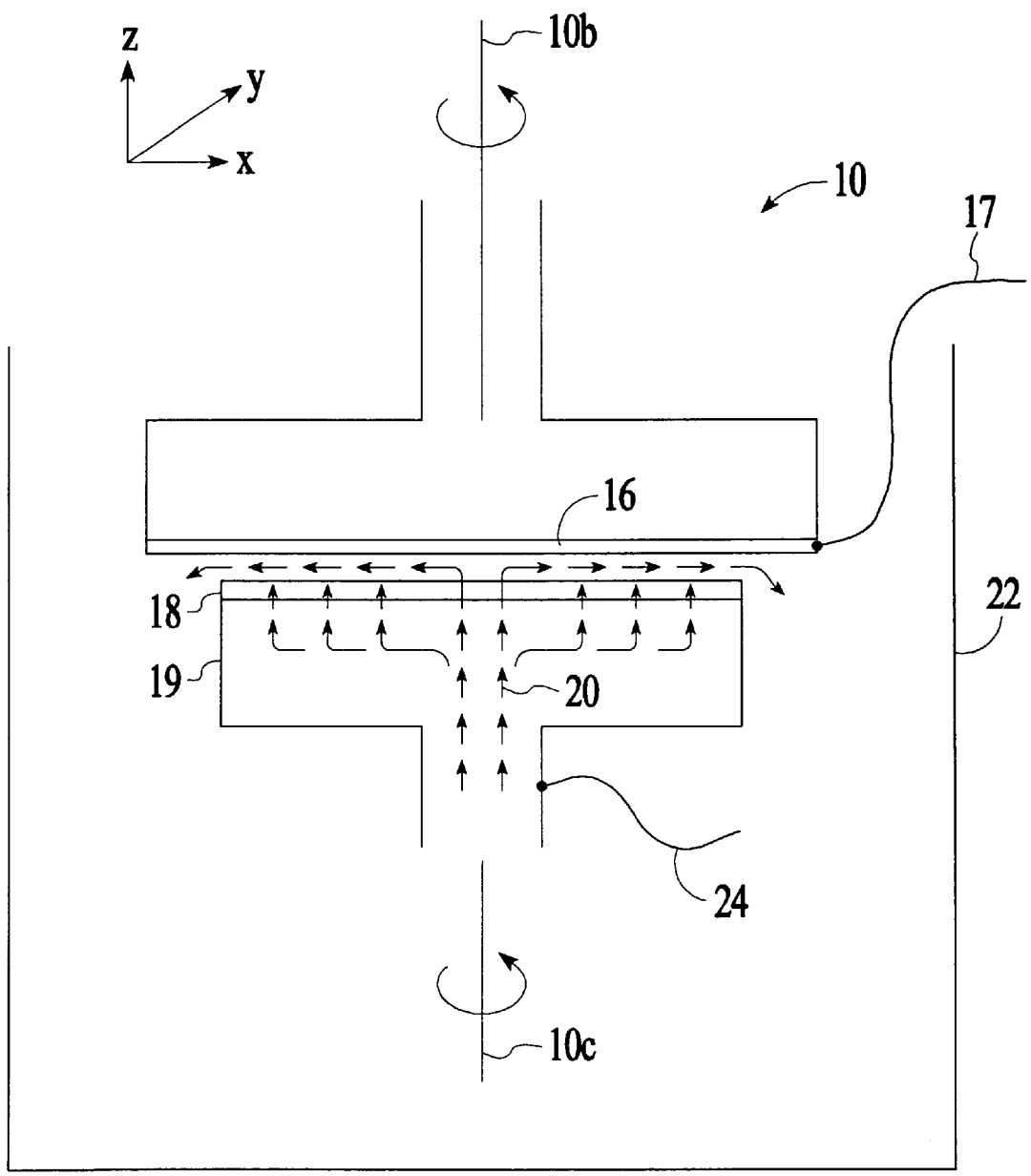
FIG. 4 illustrates an example of an electrochemical mechanical deposition apparatus.

This invention can be used to fill both small and large features. However, a serial process can also be utilized. In that approach, there are two processing steps. During the first step the mask is pulled away from the wafer surface allowing substantial amount of plating solution between the mask and the wafer surface. In this position, the system acts just like a traditional plating cell. With the help of the additives in the plating solution, the small features are filled during this step and the situation as shown in FIG. 2b occurs. During this first step, the mask and the substrate are moved with respect to each other for uniform deposition. Then the mask is brought in contact with the surface squeezing out the solution from the wafer/mask interface except at the holes/openings on the mask. Mask-pulsed plating then commences to preferentially fill the larger features as described earlier. It is important to note that in the mask-pulsed plating technique, there is substantially no plating solution between the mask and the wafer surface except where the mask holes/openings are positioned.

Along with using copper and its alloys as the conductive material, other conductive materials such as copper alloys, iron, nickel, chromium, indium, lead, tin, lead-tin alloys, nonleaded solderable alloys, silver, zinc, cadmium, ruthenium, their respective alloys may be used in the present invention. The present invention is especially suited for the fabrication of high performance and highly reliable chip interconnect, packaging, magnetic, flat panel and opto-electronic applications.

In the previous descriptions, numerous specific details are set forth, such as specific materials, mask designs, pressures, chemicals, processes, etc., to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiment are possible without materially departing from the novel teachings and advantages of this invention.

I claim:

1. A method of plating a conductive top surface of a workpiece, the conductive top surface of the workpiece including a top portion and a cavity portion, the method comprising the steps of:

applying, over the conductive top surface of the workpiece, an electrolyte solution with at least one additive disposed therein, wherein a first amount of the additive becomes adsorbed on the top portion and a second amount of the additive becomes adsorbed on the cavity portion;

applying an external influence to the top portion, the external influence removing from the tap portion of the workpiece a part of the first amount of the additive previously adsorbed on the top portion; and plating the conductive top surface of the workpiece before the additive fully re-adsorbs onto the top portion, thereby causing greater plating of the cavity portion relative to the top portion.

2. The method according to claim 1 wherein the step of applying the external influence uses a movable mask applied over the conductive top surface of the workpiece to physically sweep the first amount of the additive adsorbed on the top portion, thereby reducing the amount of the additive adsorbed on the top portion for a period of time.

3. The method according to claim 2, wherein the movable mask in the step of applying the external influence makes a physical contact with the top portion of the workpiece.

4. The method according to claim 3 wherein the step of applying the external influence with the movable mask causes an area of the top portion which had previously been subjected to the external influence to align with an open area of the movable mask so that during the step of plating a plating current exists between the area of the workpiece and an anode.

5. The method according to claim 4 wherein during the step of plating, a current pulse with a first current density is formed within the open area of the movable mask between the anode and the area of the workpiece, the first current density being greater than a second current density that exists in another area of the workpiece that is covered by the moveable mask.

6. The method according to claim 5 wherein, over a period of time, a plurality of current pulses are formed between the anode and different areas of the workpiece.

7. The method according to claim 6 wherein the plurality of current pulses, summed together, equal a DC current provided by a power source.

8. The method according to claim 4 wherein the step of plating includes the step of providing DC power during plating.

9. The method according to claim 8 wherein the step of providing DC power operates in a current controlled mode in which a plating current is held substantially constant.

10. The method according to claim 8 wherein the step of providing DC power operates in a voltage controlled mode in which a plating voltage is held substantially constant.

11. The method according to claim 1 wherein the at least one additive includes an accelerator.

12. The method according to claim 11 wherein, during the step of plating, more additive is adsorbed on the cavity portion than on the top portion.

13. The method according to claim 12 wherein the step of plating takes place only before the part of the first amount of the additive that was removed fully re-adsorbs.

14. The method according to claim 12 wherein the steps of applying the external influence and plating are repeated.

15. The method according to claim 1 wherein the at least one additive includes a plurality of additives, comprising both an inhibitor and an accelerator.

16. The method according to claim 15 wherein, the step of applying the external influence removes a greater percentage of the accelerator than the inhibitor as a result of the inhibitor having a stronger adsorption characteristic than the accelerator.

17. The method according to claim 16 wherein the step of plating takes place only before the accelerator that was removed fully re-adsorbs onto the top portion.

18. The method according to claim 17 wherein the steps of applying the external influence and plating are repeated.

19. The method according to claim 15 wherein, after the step of applying the external influence, the inhibitor re-adsorbs more quickly than the accelerator onto the top portion of the workpiece.

20. The method according to claim 19 wherein the step of plating takes place after the inhibitor re-adsorbs and before the accelerator that was removed fully re-adsorbs onto the top portion.

21. The method according to claim 20 wherein the steps of applying the external influence and plating are repeated.

22. The method according to claim 1 wherein the step of plating includes the step of providing pulsed power during plating.

23. The method according to claim 1 wherein the step of plating includes the step of providing DC power during plating.

24. The method according to claim 1 wherein the step of plating plates copper.

25. The method according to claim 1 wherein the step of plating plates a copper alloy.

26. The method according to claim 1 wherein the step of applying the external influence to the top portion causes a differential in a surface resistance between the top portion and the cavity portion.

27. The method according to claim 1 wherein the step of applying the external influence uses a mask applied over the conductive top surface of the workpiece, and relative movement between the mask and the workpiece causes physical sweeping of the first amount of the additive adsorbed on the top portion, thereby reducing the amount of the additive adsorbed on the top portion for a period of time.

28. The method according to claim 27 wherein the movable mask in the step of applying the external influence makes a physical contact with the top portion of the workpiece.

29. The method according to claim 27 wherein the step of applying the external influence with the movable mask causes an area of the top portion which had previously been subjected to the external influence to align with an open area of the movable mask so that during the step of plating a plating current exists between the area of the workpiece and an anode.

30. The method according to claim 1 further including the step of adding another additive to the electrolyte that assists in loosening a bond between the additive and the surface of the workpiece.

* * * * *